US012349266B2

(12) United States Patent
Watson et al.

(10) Patent No.: US 12,349,266 B2
(45) Date of Patent: Jul. 1, 2025

(54) EXTERNALLY GROUNDED PRINTED CIRCUIT BOARD

(71) Applicant: Knowles Electronics, LLC, Itasca, IL (US)

(72) Inventors: Joshua Watson, Aurora, IL (US); Adam Ariffin, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/126,733

(22) Filed: Dec. 18, 2020

(65) Prior Publication Data

US 2021/0204394 A1    Jul. 1, 2021

Related U.S. Application Data

(60) Provisional application No. 62/955,385, filed on Dec. 30, 2019.

(51) Int. Cl.
| | |
|---|---|
| *H05K 1/02* | (2006.01) |
| *B81B 7/00* | (2006.01) |
| *B81C 1/00* | (2006.01) |
| *H05K 1/18* | (2006.01) |
| *H05K 3/40* | (2006.01) |

(52) U.S. Cl.
CPC ......... *H05K 1/0215* (2013.01); *B81B 7/0006* (2013.01); *B81C 1/00095* (2013.01); *H05K 1/181* (2013.01); *H05K 3/403* (2013.01); *B81B 2201/0257* (2013.01); *H05K 2201/10083* (2013.01)

(58) Field of Classification Search
CPC ................................... H05K 1/0215

USPC .......................................................... 361/753
See application file for complete search history.

(56) References Cited

U.S. PATENT DOCUMENTS

| | | | | |
|---|---|---|---|---|
| 5,729,441 | A * | 3/1998 | Murakami ........... | H05K 9/0037 361/753 |
| 2007/0235849 | A1* | 10/2007 | Othieno .................. | H01L 23/50 257/678 |
| 2011/0133995 | A1* | 6/2011 | Pascolini ............... | H01Q 1/243 343/702 |
| 2012/0044653 | A1* | 2/2012 | Morris ................. | H05K 9/0024 361/728 |
| 2012/0274602 | A1* | 11/2012 | Bita ...................... | G06F 3/0443 345/174 |
| 2014/0374852 | A1* | 12/2014 | Raleigh ................. | B81C 1/0023 438/51 |
| 2017/0041692 | A1* | 2/2017 | Watson .................. | H04R 19/04 |

(Continued)

*Primary Examiner* — Stanley Tso
(74) *Attorney, Agent, or Firm* — Hickman Becker Bingham Ledesma LLP; Matthew C. Loppnow

(57) ABSTRACT

According to some embodiments, the present disclosure is directed to a printed circuit board for a microphone assembly that includes a top layer structured for a MEMS transducer to be mounted thereon, a bottom layer, at least one edge, a ground plane, and a conductor electrically connected to the ground plane and the bottom layer. The MEMS transducer includes a transducer substrate, a back plate and a diaphragm. The conductor extends vertically from the top layer to the bottom layer of the printed circuit board, and horizontally along a portion of a length of at least one edge of the printed circuit board. The printed circuit board includes two short edges and two long edges, and the conductor is connected to at least one of the four edges.

12 Claims, 6 Drawing Sheets

(56) References Cited

U.S. PATENT DOCUMENTS

| | | | | |
|---|---|---|---|---|
| 2018/0343524 A1* | 11/2018 | Lim | ............... | H04R 19/005 |
| 2019/0164904 A1* | 5/2019 | Katsumata | ............ | H01L 21/486 |
| 2019/0361045 A1* | 11/2019 | Abdolvand | ........... | G01P 15/125 |
| 2020/0196452 A1* | 6/2020 | Lee | ................... | H05K 1/189 |
| 2021/0144849 A1* | 5/2021 | Leitgeb | ............. | H05K 1/0346 |

* cited by examiner

US 12,349,266 B2

EXTERNALLY GROUNDED PRINTED CIRCUIT BOARD

CROSS-REFERENCE TO RELATED APPLICATIONS

The present application claims the priority benefit of U.S. Provisional Patent Application No. 62/955,385, filed Dec. 30, 2019, which is incorporated herein by reference.

FIELD OF THE DISCLOSURE

The present disclosure relates to microelectromechanical systems (MEMS) devices, and in particular, to printed circuit boards from which microphone device unit cells (individual packages) are diced and methods therefor.

BACKGROUND

Microphone devices that include microelectromechanical systems (MEMS) acoustic transducers convert acoustic energy into an electrical signal. The microphone assemblies may be employed in mobile communication devices, laptop computers, and appliances, among other devices and machinery. An important consideration for a microphone device is the elimination of noise, often caused by radio-frequency (RF) signal coupling. As the complexity of these devices increase, so does the complexity of the printed circuit boards to which these devices connect, resulting in design difficulties.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

DETAILED DESCRIPTION

Figure 1:
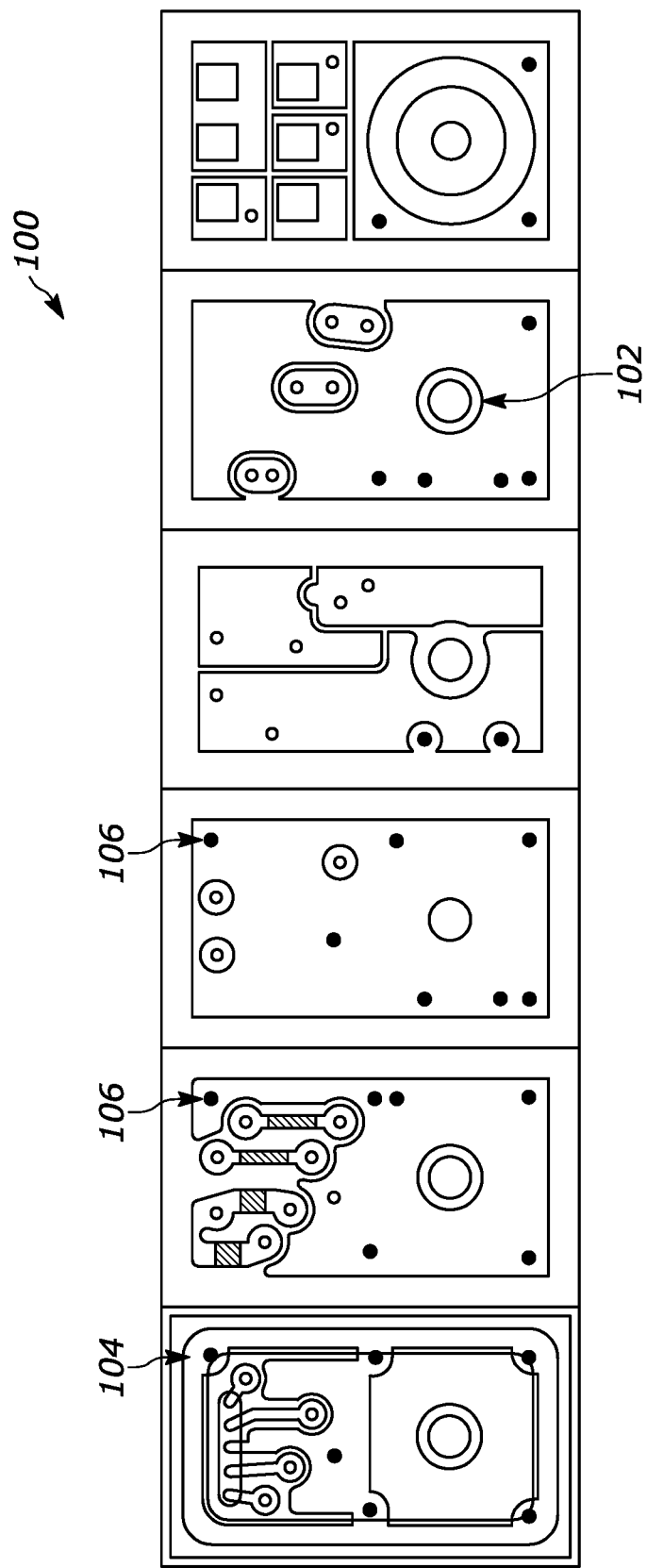
FIG. 1 is a schematic diagram of a plurality of complex printed circuit board designs for use in a microphone assembly.

In general, disclosed herein are devices and methods for producing printed circuit board unit cells for microphone assemblies with an external ground to reduce radio-frequency (RF) signal interference. The printed circuit board includes a top layer structured for a MEMS transducer to be mounted thereon, a bottom layer, at least one edge, a ground plane, and a conductor. The MEMS transducer may be a capacitive acoustic transducer including a stationary back plate and a moveable diaphragm which are configured to convert acoustic energy incident on the diaphragm into an electrical signal. The MEMS transducer can include a transducer substrate that includes a first port over which the diaphragm and back plate are disposed to receive acoustic energy from an external environment. The printed circuit board can include a second port that aligns with the first port to provide fluid communication from the external environment to the MEMS transducer.

As the complexity of integrated circuits has increased, the design of printed circuit boards has been likewise affected such that a single ground via may be undesirable or insufficient for the number of components and connections required by the circuit to perform correctly. Increasing the number of ground vias is often difficult as a result of trying to optimize space of the printed circuit board, while reducing the number of ground vias increases the impedance to ground, thereby limiting the effectiveness of the metal shield and embedded capacitance filters. It is not optimal to place ground vias directly beneath the MEMS transducer, as this placement directs RF currents beneath the MEMS transducer and causes RF coupling to the MEMS transducer. RF coupling to the MEMS transducer results in degraded RF immunity. Similarly, power supply noise shunted through the embedded capacitance filters through a ground via beneath the MEMS transducer may couple to the MEMS transducer and degrade the Power Supply Rejection Ratio (PSRR). RF signals that couple into the integrated circuit will be demodulated and any audio frequency present in the demodulated RF signal will emerge on the microphone output as undesired noise. In addition, power supply noise can also pass through the integrated circuit output as undesired noise.

The solution proposed herein is to provide a low-impedance path (e.g., a single low-impedance path) on the outer edges of the printed circuit board for RF currents to reduce the probability of RF coupling into the integrated circuit by acting as a board-level shield protecting the components on the printed circuit board. The low-impedance path will be a conductor coupled to the ground planes of the printed circuit board, reducing the number of ground vias to a single external ground useable by all components. This solution will allow more space for routing options for traces, resistors, and larger capacitors based on the requirements of the integrated circuit. Furthermore, this method of producing a printed circuit board produces reduced amounts of dicing slurry, a waste byproduct of panel dicing, thereby reducing material loss and waste contributions. This solution will be further explained with reference to FIGS. 1-4.

In FIG. 1, there is shown an exemplary schematic diagram 100 of a plurality of complex printed circuit board designs for use in a microphone assembly according to some embodiments. Each design includes a port 102 structured to align with a port of an acoustic transducer. An example outline of a MEMS acoustic transducer 104 can be seen covering ground vias 106. Each design also includes multiple ground vias 106 in an attempt to accommodate the necessary footprints of the MEMS transducer 104 and an integrated circuit (not pictured).

Figure 2A:
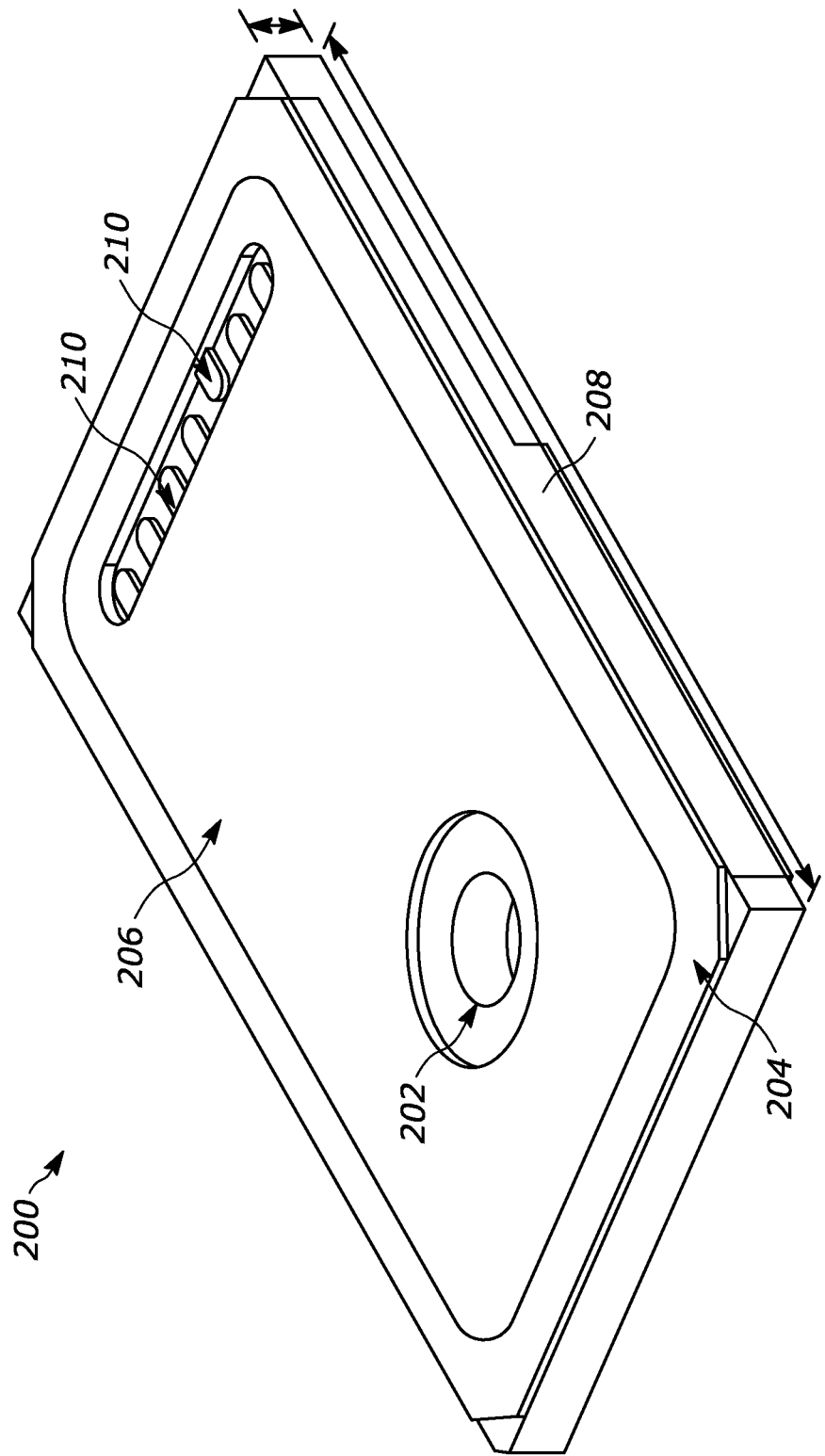
FIG. 2A is an example illustration of a diced printed circuit board with an external ground.
Figure 2B:
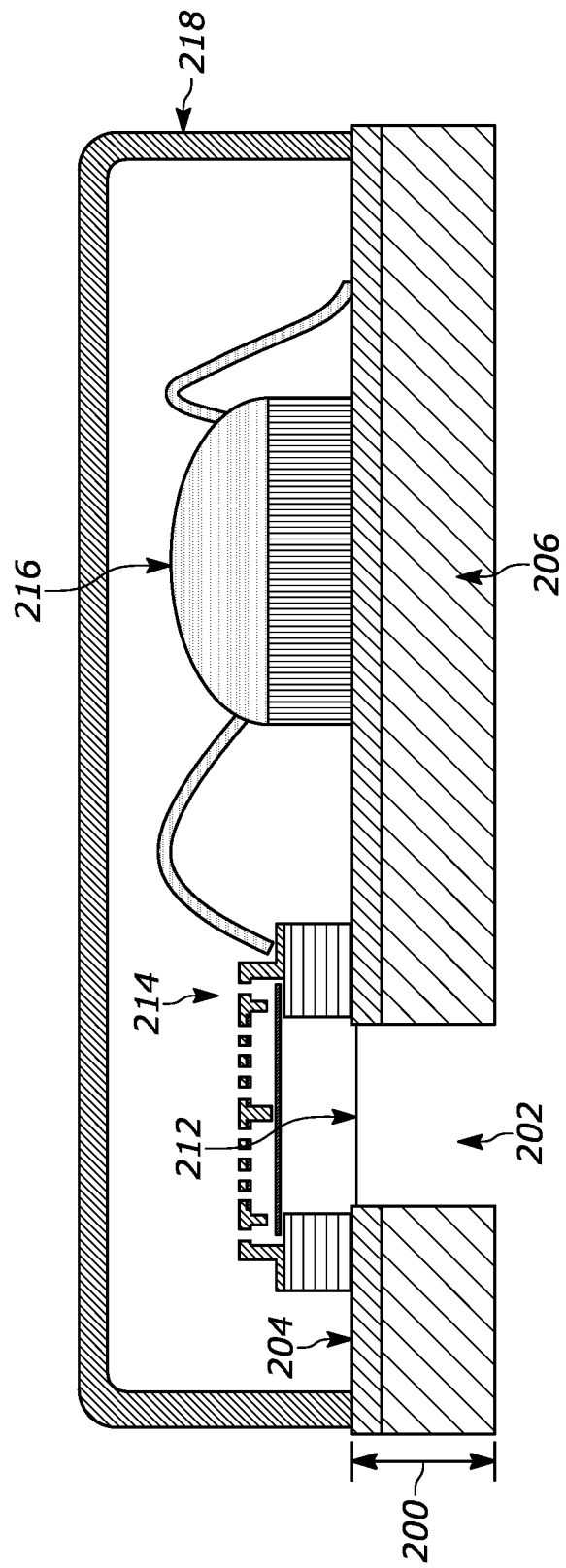
FIG. 2B is an example illustration of an acoustic transducer and integrated circuit mounted on the externally grounded printed circuit board according to the embodiment of FIG. 2A.

In FIGS. 2A-B, there is shown an exemplary illustration of a printed circuit board unit cell 200 and various microphone assembly components mounted to the printed circuit board. FIG. 2A illustrates the printed circuit board unit cell 200 without the other microphone assembly components, and FIG. 2B illustrates a microphone assembly disposed in a housing that includes the printed circuit board unit cell 200 after components have been mounted thereon, a MEMS transducer 214 (e.g., an acoustic transducer) disposed on the unit cell 200, and a cover 218 attached to the unit cell 200. The unit cell 200 includes a port 202 and an external ground 204. The port 202 may align or partially align with an aperture 212 of the transducer 214. The port 202 may be formed on the printed circuit board or in another portion of the housing such as the cover 218. The external ground 204 surrounds a top layer 206 of the unit cell 200, and extends along an edge 208. According to some embodiments, the external ground 204 can extend the full horizontal length and vertical height of the edge 208, or can extend a partial length of the edge 208 as pictured. The edge 208 can be one of a short edge or a long edge of the rectangular prism-shaped unit cell as illustrated. In some embodiments, the unit cell 200 may be a different polygon structured to receive a MEMS transducer mounted thereon. The unit cell 200 can include a set of electrical connections 210 for soldering to the MEMS transducer 214 and/or integrated circuit components 216. The cover 218 encloses a volume in which the MEMS transducer 214 and the integrated circuit components 216 are disposed. The housing including printed circuit board is surface-mountable and includes an external device interface to which the integrated circuit is electrically coupled through the electrical connections 210. The external device interface allows for the microphone assembly to be mounted in an external device such as a telephone, computer, or other device capable of voice recording.

According to some embodiments, the printed circuit board unit cell 200 contains a plurality of layers, including a bottom layer, a top layer, and at least one ground plane. The external ground 204 is electrically connected to the at least one ground plane along a length of the edge 208 to provide increased surface area to the ground plane and electrically connect the ground plane to the bottom layer. The external ground 204 is created by routing the edge 208 prior to the electroplating process during manufacture of the printed circuit board.

Figure 3:
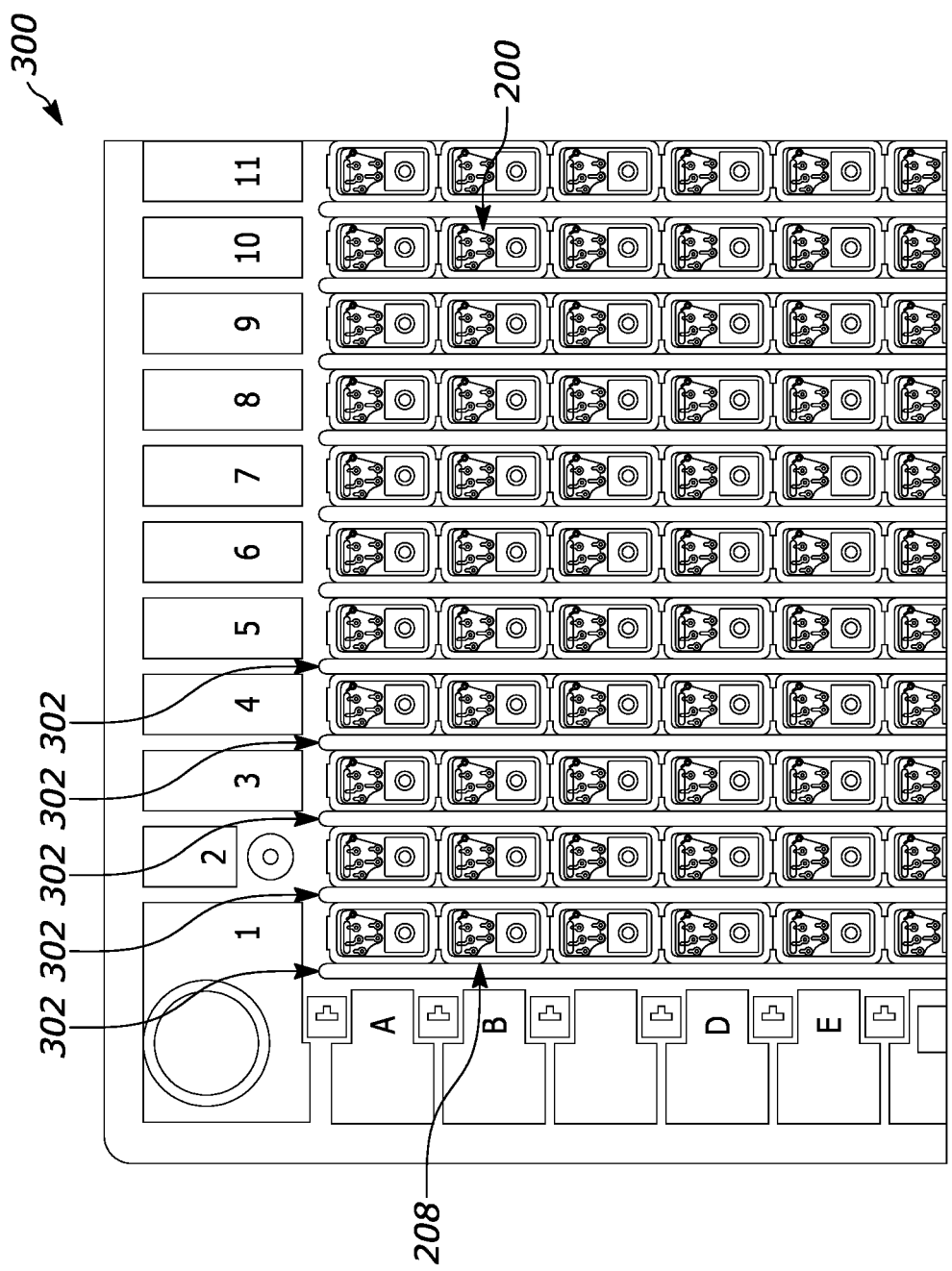
FIG. 3 is an example illustration of a pre-dicing printed circuit board during manufacture.

FIG. 3 is an exemplary embodiment of a printed circuit board panel 300 prior to dicing according to some embodiments. A plurality of routing lines 302 can be seen in between columns of unit cells 200 along an edge 208. The edges 208 of the unit cells 200 are routed along routing lines 302 to expose the conductive layers of the printed circuit board prior to electroplating. In some embodiments, the routed edge 208 may occur on a short edge as opposed to the long edge pictured in the figure. Routing prior to electroplating causes a portion of the printed circuit board panel 300 to go unused, reducing the number of unit cells per panel. However, the benefits of ease of design and increased space for traces on each unit cell minimizes production loss.

Figure 4:
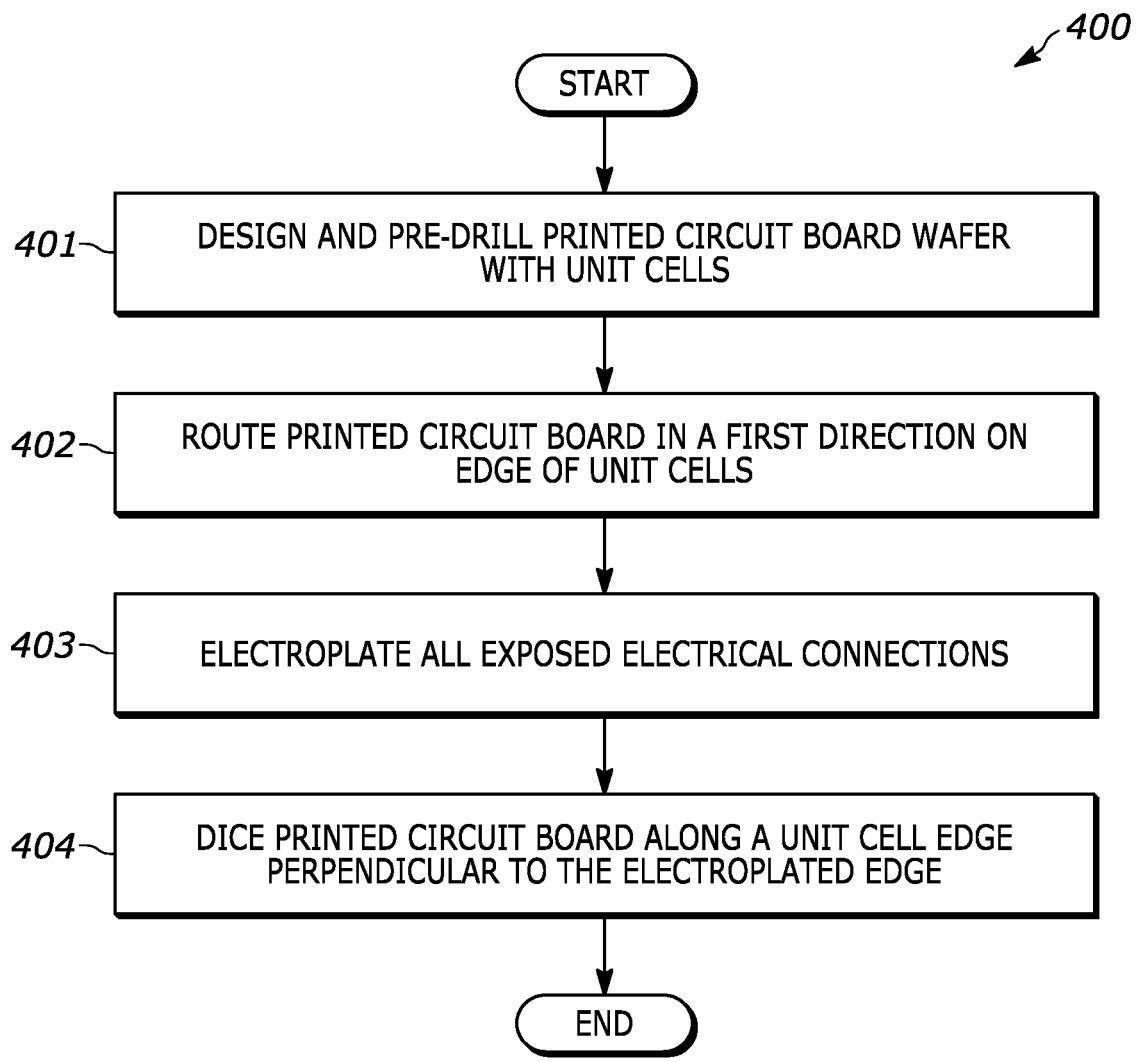
FIG. 4 is a flowchart of an exemplary method of manufacturing externally grounded printed circuit boards.

FIG. 4 is a flowchart of an exemplary method 400 of manufacturing externally grounded printed circuit boards according to some embodiments. The method 400 starts with a step 401 that includes designing the circuit and pre-drilling a printed circuit board panel (wafer) to create columns of individual unit cells. Designing the printed circuit board includes determining routed circuit connections and placement of circuit components and generating a pattern. Pre-drilling the printed circuit board panel includes drilling holes for connections to the MEMS transducer, capacitors, resistors, or other circuit components part of the design according to the pattern. In some embodiments the printed circuit board panel undergoes deburring to remove excess material.

Method 400 continues with a step 402 that includes routing the printed circuit board panel in a first direction on an edge of the columns of unit cells after final lamination according to some embodiments. Routing the printed circuit board in a first direction exposes at least one ground plane. Step 402 may include following routing with application of a photoresist or other type of mask. The mask applied in step 402 covers designated areas of the printed circuit board and prevents electroplating from occurring where undesired. This ensures a short circuit will not occur in the printed circuit board.

In some embodiments, a subsequent step 403 includes electroplating the printed circuit board to electrically connect at least one ground plane to the bottom layer and designated traces. Electroplating deposits a conductor, typically copper, nickel, tin or gold, or a combination thereof on exposed surfaces of the printed circuit board. Step 403 causes a conductor to form on the exposed edge of the columns of unit cells. The conductor electrically connects the ground plane exposed in step 402 and the bottom layer of the printed circuit board, creating an external ground. The extent of the external ground on the edge of the printed circuit board is a result of whether a mask was placed over a portion of the edge. In the event no mask was placed to cover any of the exposed edge prior to electroplating, the external ground extends from a first corner horizontally along a full length of each unit cell to a second corner, and from the top layer to the bottom layer. The external ground is electrically connected to the bottom layer of the printed circuit board unit cell, but can be electrically isolated from the top layer and all traces.

Step 403 is followed by a step 404 that includes dicing the printed circuit board panel to separate the columns of unit cells into individual unit cells. Dicing occurs in a direction perpendicular to the routing direction determined in step 402. Since routing separated the unit cells in a first direction (e.g., vertical direction), dicing only occurs in a second (e.g., horizontal) direction along the unexposed edges of the unit cells. Between step 403 and step 404, an additional step may include adding a solder mask and a final Electroless Nickel Immersion Gold (ENIG) or Electroless Nickel Electroless Palladium Immersion Gold (ENEPIG) finish. Prior to dicing the unit cells, a MEMS acoustic transducer may be mounted thereon.

Figure 5:
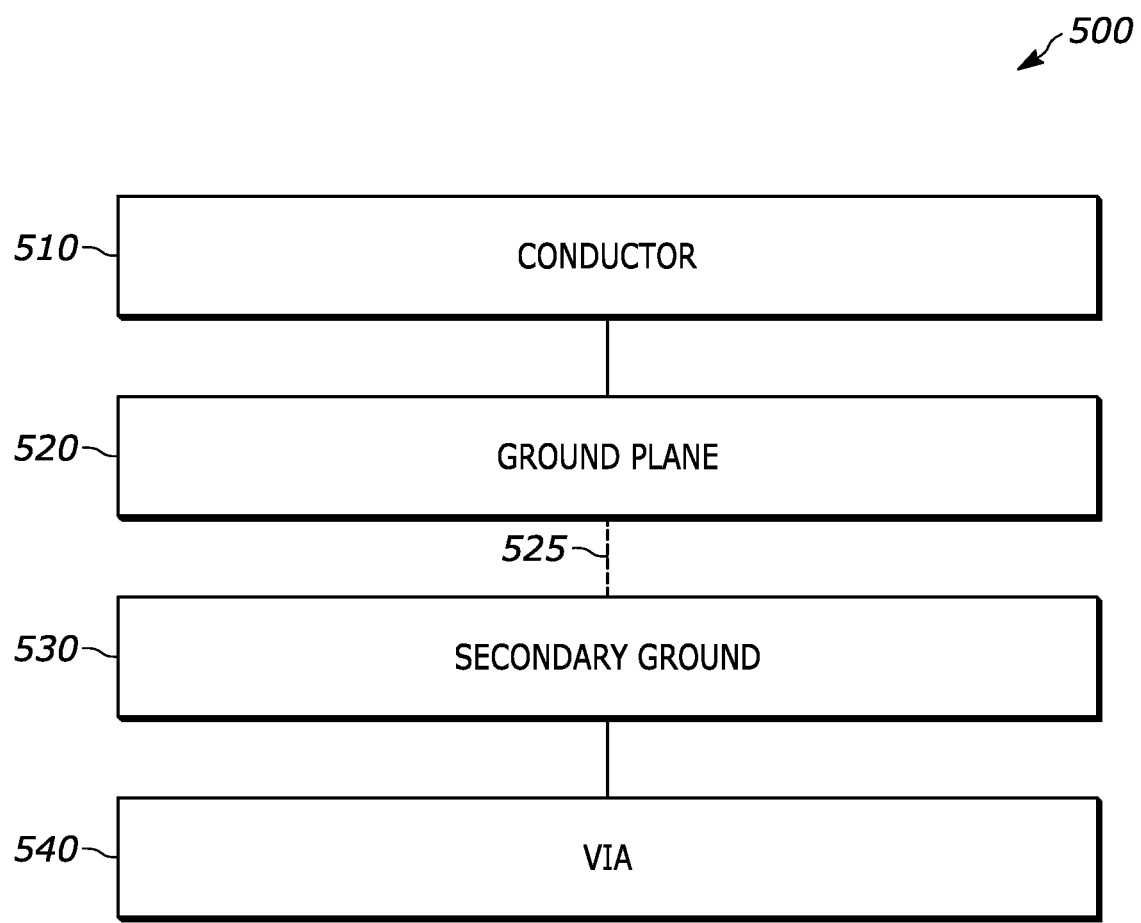
FIG. 5 is an example block diagram of elements of a printed circuit board unit cell.

FIG. 5 is an example block diagram of elements of a printed circuit board unit cell 500 according to a possible embodiment. The elements of the unit cell 500 can include a conductor 510, such as the external ground 204 of the printed circuit board unit cell 200. The elements of the unit cell 500 can also include other elements of the printed circuit board unit cell 200. The elements of the unit cell 500 can further include a ground plane 520, a secondary ground 530, and a via 540, such as the via 106. The conductor 510 can be electrically connected to the ground plane 520. The via 540 can be a single via electrically connected to the secondary ground 530 for connection to an integrated circuit (not shown). The ground plane 520 and the secondary ground 530 can be electrically connected 525 or electrically isolated.

According to the embodiments described herein, a microphone assembly comprises a housing having a sound port and a surface-mountable external-device electrical interface, a MEMS transducer disposed in the housing, and an integrated circuit disposed in the housing, the housing including a printed circuit board with the MEMS transducer mounted thereon. The printed circuit board includes a conductor electrically connected to a ground plane. The conductor extends vertically from a top layer to a bottom layer of the printed circuit board, and horizontally along a length of the at least one edge of the printed circuit board. The conductor can extend along a portion of the length of the at least one edge of the printed circuit board. The printed circuit board includes two short edges and two long edges longer than the short edges. In other words, the printed circuit board is a rectangular prism or similar three-dimensional shape. The at least one edge of the printed circuit board along which the conductor extends can be either at least one of the long edges or at least one of the short edges. The printed circuit board can further include a single via electrically connected to a secondary ground for connection to an integrated circuit. The at least one ground plane and the secondary ground can be electrically isolated or electrically connected depending on the needs of the microphone assembly.

The integrated circuit is coupled to the MEMS transducer and to contacts of the external-device electrical interface. The MEMS transducer comprises a substrate having an aperture disposed at least partially over the sound port, an electro-acoustic transduction element, and electrical contacts coupled to the transduction element. The transduction element can be a variable capacitor comprising a fixed electrode and a movable electrode located at least partially over the aperture of the substrate. The moveable electrode is configured to move with respect to the fixed electrode in response to incident acoustic energy entering the sound port to generate an electrical signal. The moveable electrode can include layers of piezoelectric material.

According to the embodiments described herein, a manufacturing method for an externally grounded printed circuit board unit cells includes exposing at least one ground plane on at least one edge of a unit cell by routing a printed circuit board wafer containing unit cells in a first direction such that a row of unit cells contain an exposed edge. The manufacturing method further includes electroplating a conductor on the at least one edge of the unit cell, wherein the conductor is electrically connected to the at least one ground plane and extends along the at least one edge of the unit cell in the first direction. The manufacturing method further includes dicing the printed circuit board along an edge perpendicular to the at least one electroplated edge of the unit cells in a second direction.

The conductor created by the manufacturing method is electrically connected to the at least one ground plane and extends vertically from a bottom layer of the printed circuit board to a top layer of the printed circuit board. The conductor further extends horizontally from a first end of the electroplated edge to a second end. The length of the at least one edge of the unit cell can be the full length or a portion of the length. The at least one edge of the unit cell can be one of a long edge and a short edge. The unit cell can include a single via electrically connected to a secondary ground for connection to an integrated circuit. The unit cell is structured for a MEMS transducer to be mounted thereon prior to the dicing step provided in the manufacturing method.

According to the embodiments described herein, a printed circuit board for a microphone assembly comprises a top layer, a bottom layer, at least one edge, a ground plane, and a conductor electrically connected to the ground plane. The conductor can extend vertically from the top layer to the bottom layer of the printed circuit board unit cell, and horizontally along a length of the at least one edge of the printed circuit board unit cell. The top layer and the bottom layer have a port formed therethrough.

The length of the at least one edge along which the conductor extends can be the full length or a portion of the length. The printed circuit board includes two short edges and two long edges longer than the short edges. In other words, the printed circuit board is a rectangular prism or similar three-dimensional shape. The at least one edge of the printed circuit board can be either a long edge or a short edge. The printed circuit board can include a single via electrically connected to a secondary ground for connection to an integrated circuit, and the ground plane and the secondary ground may by electrically connected or electrically isolated.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A MEMS microphone assembly comprising:
   a housing having a sound port and a surface-mountable external-device electrical interface;
   a MEMS transducer disposed in the housing and configured to generate an electrical signal in response to detecting sound entering the sound port; and
   an integrated circuit disposed in the housing, the integrated circuit coupled to the MEMS transducer and to contacts of the external-device electrical interface,
   the housing comprising a printed circuit board (PCB) having a conductor electrically connecting a ground plane to an external ground, the conductor extending vertically from a top layer of the PCB to a bottom layer of the PCB and horizontally along a length of at least one edge of the PCB,
   wherein an area of the PCB is underneath the MEMS transducer, and
   wherein the conductor provides a low-impedance path that is away from the area of the PCB underneath the MEMS transducer, where the low-impedance path is for radio frequency currents to the ground plane,
   wherein the PCB includes a single via electrically connected to a secondary ground for connection to the integrated circuit,
   wherein the ground plane and the secondary ground are electrically isolated, and
   wherein the MEMS transducer comprises:
      a substrate comprising an aperture aligned at least partially with the sound port;
      an electro-acoustic transduction element located at least partially over the aperture and coupled to the substrate; and
      electrical contacts coupled to the transduction element, wherein the transduction element comprises a back plate and a diaphragm comprising layers of piezoelectric material located at least partially over the aperture of the substrate.

2. The MEMS microphone assembly of claim 1, wherein the length of the at least one edge of the PCB is a full length of the edge of the PCB.

3. The MEMS microphone assembly of claim 1, wherein the PCB comprises two short edges and two long edges longer than the short edges, and wherein the at least one edge of the PCB along which the conductor extends is at least one of the long edges.

4. The MEMS microphone assembly of claim 1, wherein the PCB comprises two short edges and two long edges longer than the short edges, and wherein the at least one edge of the PCB along which the conductor extends is at least one of the short edges.

5. The MEMS microphone assembly of claim 1, wherein the external ground is coupled to a cover.

6. The MEMS microphone assembly of claim 1, wherein the external ground surrounds a top layer of the PCB outside the area of the PCB underneath the MEMS transducer.

7. The MEMS microphone assembly of claim 1, wherein the conductor extends vertically from the top layer of the PCB to a point between the top layer and the bottom layer of the PCB along a different portion of the length of the at least one edge of the PCB.

8. A printed circuit board for a MEMS microphone assembly, the printed circuit board comprising:
   a top layer;
   a bottom layer;
   at least one edge;
   a ground plane; and
   a conductor electrically connected to the ground plane, wherein the conductor extends vertically from the top layer to the bottom layer of the printed circuit board, and horizontally along a length of the at least one edge of the printed circuit board;
   wherein the top layer and the bottom layer have a port formed therethrough,
   wherein the port provides acoustic energy to a MEMS transducer of the MEMS microphone assembly,
   wherein an area of the printed circuit board is underneath the MEMS transducer, and
   wherein the conductor provides a low-impedance path, coupled between the ground plane and an external ground, that is away from the area of the printed circuit board underneath the MEMS transducer, where the low-impedance path is for radio frequency currents to the ground plane,
   wherein the MEMS microphone assembly comprises,
      a housing having a sound port and a surface-mountable external-device electrical interface;

an integrated circuit disposed in the housing, the integrated circuit coupled to the MEMS transducer and to contacts of the external-device electrical interface; and the printed circuit board, wherein the printed circuit board includes a single via electrically connected to a secondary ground for connection to the integrated circuit, wherein the ground plane and the secondary ground are electrically isolated, and wherein the MEMS transducer comprises:
- a substrate comprising an aperture aligned at least partially with the port;
- an electro-acoustic transduction element located at least partially over the aperture and coupled to the substrate; and
- electrical contacts coupled to the transduction element,
- wherein the transduction element comprises a back plate and a diaphragm comprising layers of piezoelectric material located at least partially over the aperture of the substrate.

9. The printed circuit board of claim 8, wherein the length of the at least one edge is a full length or a portion of the length.

10. The printed circuit board of claim 8, further comprising two short edges and two long edges longer than the short edges, and wherein the at least one edge of the printed circuit board along which the conductor extends is at least one of the long edges.

11. The printed circuit board of claim 8, further comprising two short edges and two long edges longer than the short edges, and wherein the at least one edge of the printed circuit board along which the conductor extends is at least one of the short edges.

12. The MEMS microphone assembly of claim 8, wherein the conductor extends vertically from the top layer of the printed circuit board to a point between the top layer and the bottom layer of the printed circuit board along a different portion of the length of the at least one edge of the printed circuit board.

* * * * *